United States Patent
Vashchenko et al.

(10) Patent No.: US 6,815,732 B1
(45) Date of Patent: Nov. 9, 2004

(54) HIGH-VOLTAGE SILICON CONTROLLED RECTIFIER STRUCTURE

(75) Inventors: Vladislav Vashchenko, Palo Alto, CA (US); Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/666,303

(22) Filed: Sep. 18, 2003

(51) Int. Cl.[7] ............................................. H01L 29/74
(52) U.S. Cl. ...................................................... 257/107
(58) Field of Search ................................ 257/107, 108, 257/119, 110, 111, 112, 146, 173, 288, 335, 343, 409, 451, 491, 492, 500

(56) References Cited

U.S. PATENT DOCUMENTS 6,433,368 B1    8/2002    Vashchenko et al. ........ 257/173
6,696,731 B2 *   2/2004    Mallikarjunaswamy

OTHER PUBLICATIONS

U.S. patent application Ser. No. 10/649,989, Vashchenko et al., filed Aug. 27, 2003.
U.S. patent application Ser. No. 10/650,000, Vashchenko et al., filed Aug. 27, 2003.
G. Charitat, "Voltage Handling Capability and Termination Techniques of Silicon Power Semicondcutor Devices", IEEE BCTM 11.1, 2001, pp. 175–183.
Julian Z. Chen, Ajith Amerasekera and Tom Vrotsos, "Bipolar SCR ESD Protection Circuit for HIgh Speed Submicron Bipolar/BiCMOS Circuits", IEDM, pp. 337–340, (14.1–14.1.4), 1995, IEEE.

* cited by examiner

Primary Examiner—Nathan J. Flynn
Assistant Examiner—Kevin Quinto
(74) Attorney, Agent, or Firm—Mark C. Pickering

(57) ABSTRACT

A silicon controlled rectifier, which has a substrate and an overlying epitaxial layer that is formed on the substrate, is formed in the epitaxial layer to have a number of semiconductor regions with alternating dopant conductivity types where a number of the regions extend through the epitaxial layer to the substrate.

20 Claims, 12 Drawing Sheets

HIGH-VOLTAGE SILICON CONTROLLED RECTIFIER STRUCTURE

DETAILED DESCRIPTION OF THE INVENTION

Figure 1:
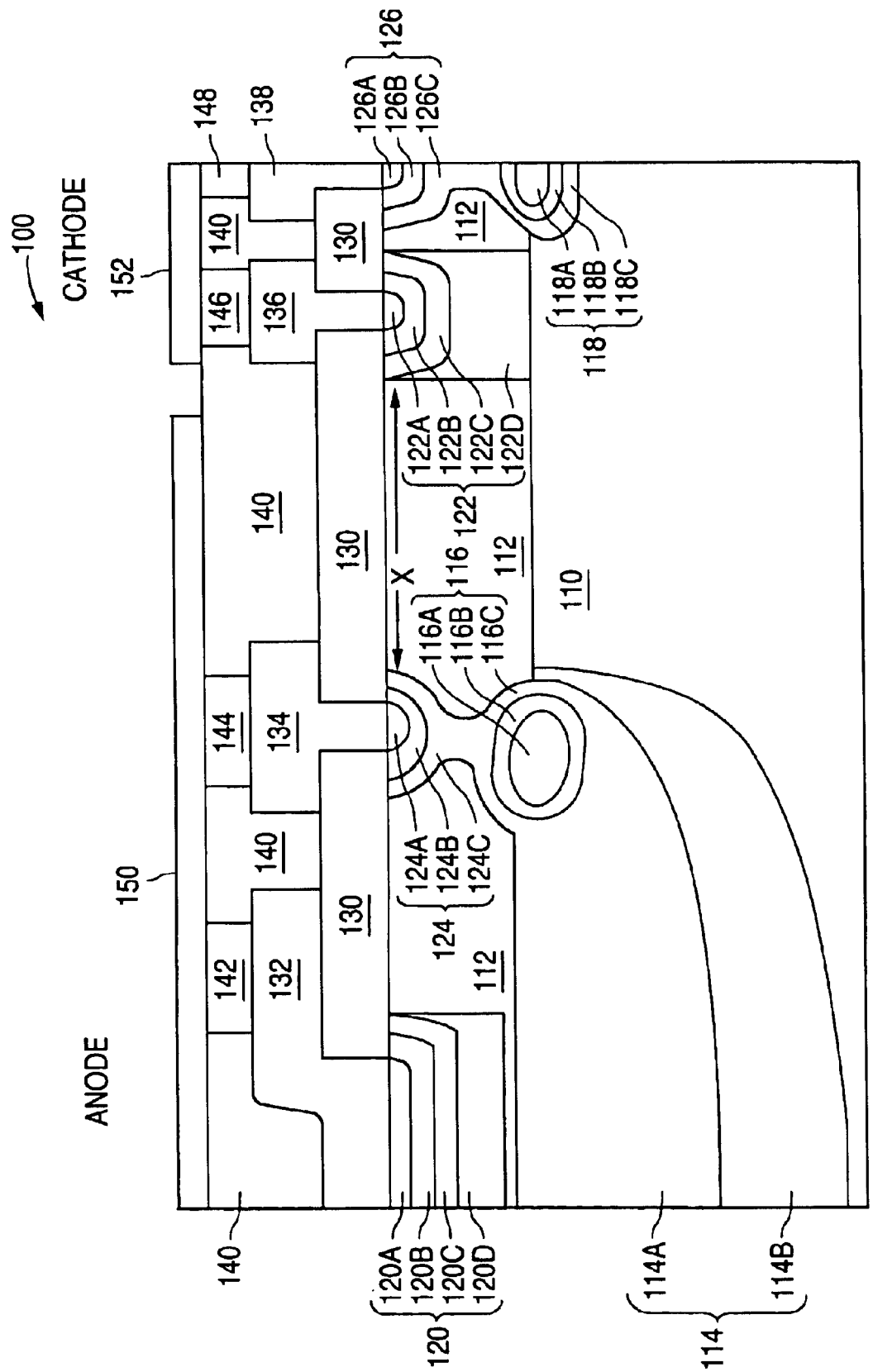
FIG. 1 is a cross-sectional view illustrating an example of a silicon controlled rectifier (SCR) structure 100 in accordance with the present invention.

FIG. 1 shows a cross-sectional view that illustrates an example of a silicon controlled rectifier (SCR) structure 100 in accordance with the present invention. As shown in FIG. 1, SCR structure 100 includes a p-type substrate 110 and an n-type epitaxial layer 112 that is formed on substrate 110. SCR structure 100 is a high-voltage device which, when compared to a conventional low-voltage bipolar device, has a substantially thicker epitaxial layer. For example, epitaxial layer 112 can be approximately 15–17 um thick.

In addition, SCR structure 100 includes an n-type well 114 that is formed in the top surface of substrate 110 and the lower region of epitaxial layer 112. As shown in FIG. 1, n-well 114 includes a center region 114A and an outer region 114B that adjoins center region 114A. Outer region 114B represents the diffusion tail of center region 114A.

Further, SCR structure 100 includes an n-type first sinker up region 116 that is formed in center region 114A and the lower region of epitaxial layer 112 near the junction between substrate 110 and well 114. First sinker up region 116 has a center region 116A, an inner region 116B that adjoins center region 116A, and an outer region 116C that adjoins inner region 116B. Regions 116B and 116C represent the diffusion tails of center region 116A.

Center region 116A has a first dopant concentration of, for example $1\times10^{20}$ (n+), while inner region 116B has a second dopant concentration of, for example, $1\times10^{19}$. Outer region 116C and center region 114A have a third dopant concentration of, for example, $1\times10^{17}$, and epitaxial layer and outer region 114B have a fourth dopant concentration of, for example, $1\times10^{15}$.

SCR structure 100 additionally includes an n-type second sinker up region 118 that is formed in substrate 110 and the lower region of epitaxial layer 112 a distance apart from n-type first sinker up region 116. Second sinker up region 118 has a center region 118A, an inner region 118B that adjoins center region 118A, and an outer region 118C that adjoins inner region 118B. Regions 118B and 118C represent the diffusion tails of center region 118A. Center region 118A has the first dopant concentration, inner region 118B has the second dopant concentration, and outer region 118C has the third dopant concentration.

Further, SCR structure 100 includes a p-type region 120 that is formed in the top surface of epitaxial layer 112. P-type region 120 has a center region 120A, an inner region 120B that adjoins center region 120A, and an outer region 120C that adjoins inner region 120B. The first and second outer regions 120B and 120C represent the diffusion tails of center region 120A. In addition, p-type region 120 includes a p-well 120D that contacts outer region 120C and extends down near center region 114A of n-well 114.

Center region 120A has a fifth dopant concentration of, for example $1\times10^{20}$ (p+), while inner region 120B has a sixth dopant concentration of, for example, $1\times10^{19}$. Outer region 120C and p-well 120D have a seventh dopant concentration of, for example, $1\times10^{17}$, and substrate 110 has an eighth dopant concentration of, for example, $1\times10^{15}$.

SCR structure 100 additionally includes a p-type region 122 that is formed in epitaxial layer 112 to extend from the top surface of n-type epitaxial layer 112 to the top surface of p-substrate 110. P-type region 122 has a center region 122A, an inner region 122B that adjoins center region 122A, and an outer region 122C that adjoins inner region 122B. In addition, p-type region 122 includes a p-well 122D that contacts both outer region 122C and p-substrate 110. The inner and outer regions 122B and 122C represent the diffusion tails of center region 122A.

Center region 122A has the fifth dopant concentration, inner region 122B has the sixth dopant concentration, and outer region 122C and p-well 122D have the seventh dopant concentration. P-well region 120D is shallower than p-well region 122D due to the out diffused presence of n-well 114.

SCR structure 100 further includes a first n-type sinker down region 124 that is formed in the top surface of epitaxial layer 112 between and spaced apart from p-type regions 120 and 122. First sinker down region 124, which is formed over first sinker up region 116, includes a center region 124A, an inner region 124B that adjoins center region 124A, and an outer region 124C that adjoins both inner region 124B and outer region 116C of first sinker up region 116. Center region 124A has the first dopant concentration, inner region 124B has the second dopant concentration, and outer region 124C has the third dopant concentration. Regions 124B and 124C represent the diffusion tails of center region 124A.

In addition, SCR structure 100 includes a second n-type sinker down region 126 that is formed in the top surface of epitaxial layer 112 spaced apart from p-type regions 120 and 122 and first sinker down region 124. Second sinker down region 126, which is formed over second sinker up region 118, includes a center region 126A, an inner region 126B that adjoins center region 126A, and an outer region 126C that adjoins both inner region 126B and outer region 118C of second sinker up region 118. Center region 126A has the first dopant concentration, inner region 126B has the second dopant concentration, and outer region 126C has the third dopant concentration. Regions 126B and 126C represent the diffusion tails of center region 120A.

As further shown in FIG. 1, SCR structure 100 includes a layer of isolation material 130 that is formed on epitaxial layer 112, a p+ polysilicon region 132 that is formed on isolation layer 130, and through isolation layer 130 to make an electrical connection with p-type region 120, and an n+ polysilicon region 134 that is formed on isolation layer 130, and through isolation layer 130 to make an electrical connection with n-type first sinker down region 124.

SCR structure 100 also includes a p+ polysilicon region 136 that is formed on isolation layer 130, and through isolation layer 130 to make an electrical connection with p-type region 122. SCR structure 100 further includes an n+ polysilicon region 138 that is formed on isolation layer 130, and through isolation layer 130 to make an electrical connection with second sinker down region 126.

Polysilicon regions 132, 134, 136, and 138 are spaced apart from each other (and can include a very thin oxide layer that contacts the epi layer which is unavoidably introduced by some fabrication processes). In addition, polysilicon regions 132, 134, 136, and 138 can include an overlying layer of silicide. In an alternate embodiment, polysilicon regions 132 and 134 can be formed as a single poly layer.

SCR structure 100 additionally includes a layer of isolation material 140 that is formed over oxide layer 130 and polysilicon regions 132, 134, 136, and 138, and a contact structure 142 that is formed through isolation layer 140 to make an electrical connection with polysilicon region 132.

In addition, SCR structure 100 includes a contact structure 144 that is formed through isolation layer 140 to make an electrical connection with polysilicon region 134, a contact structure 146 that is formed through isolation layer 140 to make an electrical connection with polysilicon region 136, and a contact structure 148 that is formed through isolation layer 140 to make an electrical connection with polysilicon region 138.

Further, SCR structure 100 includes a metal-1 trace 150 that is formed on isolation layer 140 to make an electrical connection with contact structures 142 and 144. Further, in an aspect of the present invention, metal-1 trace 150 covers a substantial portion of the distance X between p-type region 122 and n-type first sinker down region 124. When a charge is on metal-1 trace 150, trace 150 functions as an electrode that attracts charge carriers to the surface, thereby preventing or substantially reducing a lateral flow of charge carriers of the opposite conductivity type at the surface between regions 122 and 124. (Alternately, poly region 134 can cover the portion of the distance X to prevent the charge flow.)

Metal-1 trace 150, contact structure 142, contact structure 144, polysilicon region 132, polysilicon region 134, first n-type sinker down region 124, p-type region 120, and n-type epitaxial layer 112 can function as the anode of an ESD diode structure (where the anode is connected to a to-be-protected pad).

SCR structure 100 additionally includes a metal-1 trace 152 that is formed on isolation layer 140 to make an electrical connection with contact structures 146 and 148. Metal-1 trace 152, contact structure 146, contact structure 148, polysilicon region 136, polysilicon region 138, second sinker down region 126, p-type region 122, and substrate 110 as the cathode of the ESD diode structure (where the cathode is connected to a ground line).

SCR structure 100 forms a NPN bipolar transistor that utilizes n+ polysilicon region 138, second sinker down region 126, sinker up region 118, and adjoining regions of n-type epitaxial layer 112 as the emitter, polysilicon region 136, p-type region 122, and p-type substrate 110 as the base, and epitaxial layer 112, well 114, first sinker down region 116, and first sinker up region 124 as the collector. SCR structure 100 also forms a PNP transistor that utilizes p-type region 120 as the emitter, epitaxial layer 112, well 114, first sinker up region 116, and first sinker down region 124 as the base, and p-type region 122 and substrate 110 as the collector.

In operation, when a voltage on the anode of SCR structure 100 rises with respect to the voltage on the cathode, the voltage on a large n-type region (n-well 114, first sinker up region 116, first sinker down region 124, and epitaxial layer 112) rises with respect to the voltage on a large p-type region (substrate 110 and p-type region 122), thereby reverse biasing the pn junction between the large p-type and n-type regions. As a result, SCR structure 100 blocks a current, other than a leakage current, from flowing from the anode to the cathode until the anode-to-cathode voltage exceeds a breakdown voltage.

When the rising voltage on the anode exceeds the breakdown voltage, avalanche multiplication causes large numbers of holes to be injected into the large p-type region (substrate 110 and p-type region 122), and large numbers of electrons to be injected into the large n-type region (n-well 114, first sinker up region 116, first sinker down region 124, and epitaxial layer 112).

The large number of holes injected into the large p-type region (substrate 110 and p-type region 122) forward biases the pn junction between the large p-type region and an outer n-type region (epitaxial layer 112, second sinker up region 118, and second sinker down region 126). When forward biased, the outer n-type region (epitaxial layer 112, second sinker up region 118, and second sinker down region 126) injects electrons into the large p-type region (substrate 110 and region 124).

In addition, the large number of electrons injected into the large n-type region (n-well 114, first sinker up region 116, first sinker down region 124, and epitaxial layer 112) forward biases the pn junction between the large n-type region and p-type region 120. When forward biased, p-type region 120 injects holes into the large n-type region.

Further, the accumulation of positive charge in the large p-type region and the accumulation of negative charge in the large n-type region due to the injection of large numbers of holes and electrons, respectively, reduces the magnitude of the reversed biased junction until the pn junction between the large p-type region and the large n-type region switches and becomes forward biased. Once the pn junction between the large p-type and n-type regions becomes forward biased, a large current flows from the anode to the cathode, while the anode-to-cathode voltage drops to a holding voltage that is substantially lower than the breakdown voltage.

Figure 2:
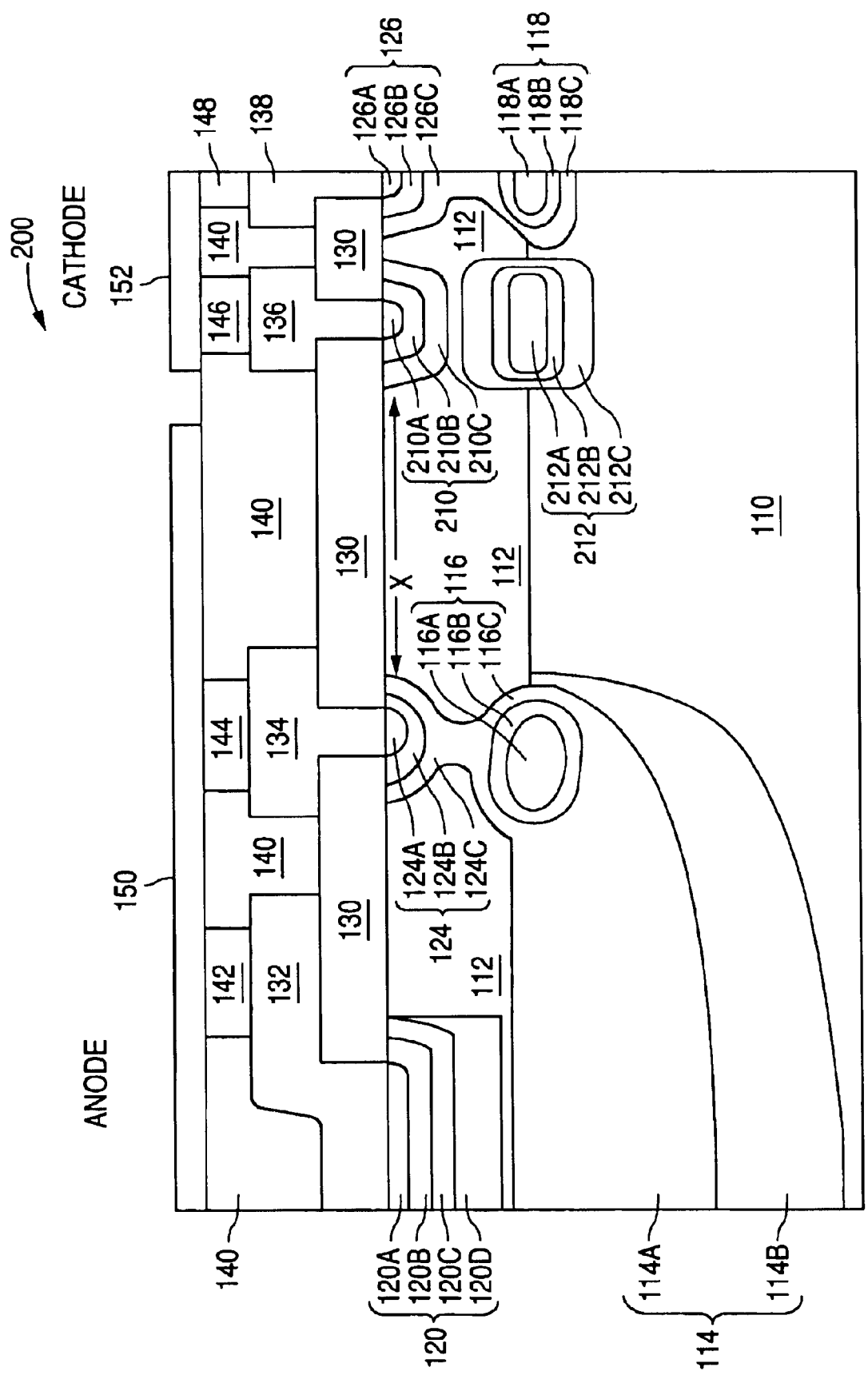
FIG. 2 is a cross-sectional view illustrating an example of a silicon controlled rectifier (SCR) structure 200 in accordance with an alternate embodiment of the present invention.

FIG. 2 shows a cross-sectional view that illustrates an example of a silicon controlled rectifier (SCR) structure 200 in accordance with an alternate embodiment of the present invention. Structure 200 is similar to structure 100 and, as a result, utilizes the same reference numerals to designate the elements which are common to both structures.

As shown in FIG. 2, SCR structure 200 differs from SCR structure 100 in that structure 200 includes a p-type region 210 and a p-type up region 212 in lieu of p-type region 122. P-type region 210, which is formed in the top surface of epitaxial layer 112, has a center region 210A, an inner region 210B that adjoins center region 210A, and an outer region 210C that adjoins inner region 210B. The first and second outer regions 210B and 210C represent the diffusion tails of center region 210A. Center region 210A has the fifth dopant concentration, inner region 210B has the sixth dopant concentration, and outer region 210C has the seventh dopant concentration.

P-type up region 212, in turn, is formed in the top surface of substrate 110 and the bottom region of epitaxial layer 112. P-type region 212 has a center region 212A, an inner region 212B that adjoins center region 212A, and an outer region 212C that adjoins inner region 212B. The first and second outer regions 212B and 212C represent the diffusion tails of center region 212A. Center region 212A has the fifth dopant concentration, inner region 212B has the sixth dopant concentration, and outer region 212C has the seventh dopant concentration.

Thus, although structures 100 and 200 show similar structures where a p-type region extends and nearly extends, respectively, from the top surface of epitaxial layer 112 to the top surface of substrate 110, well region 120D has a lower p-type dopant concentration throughout the region than does p-type up region 212. (Although p-type region 210 and p-type up region 212 are shown with a slight separation, the regions can also contact each other.)

Figure 3:
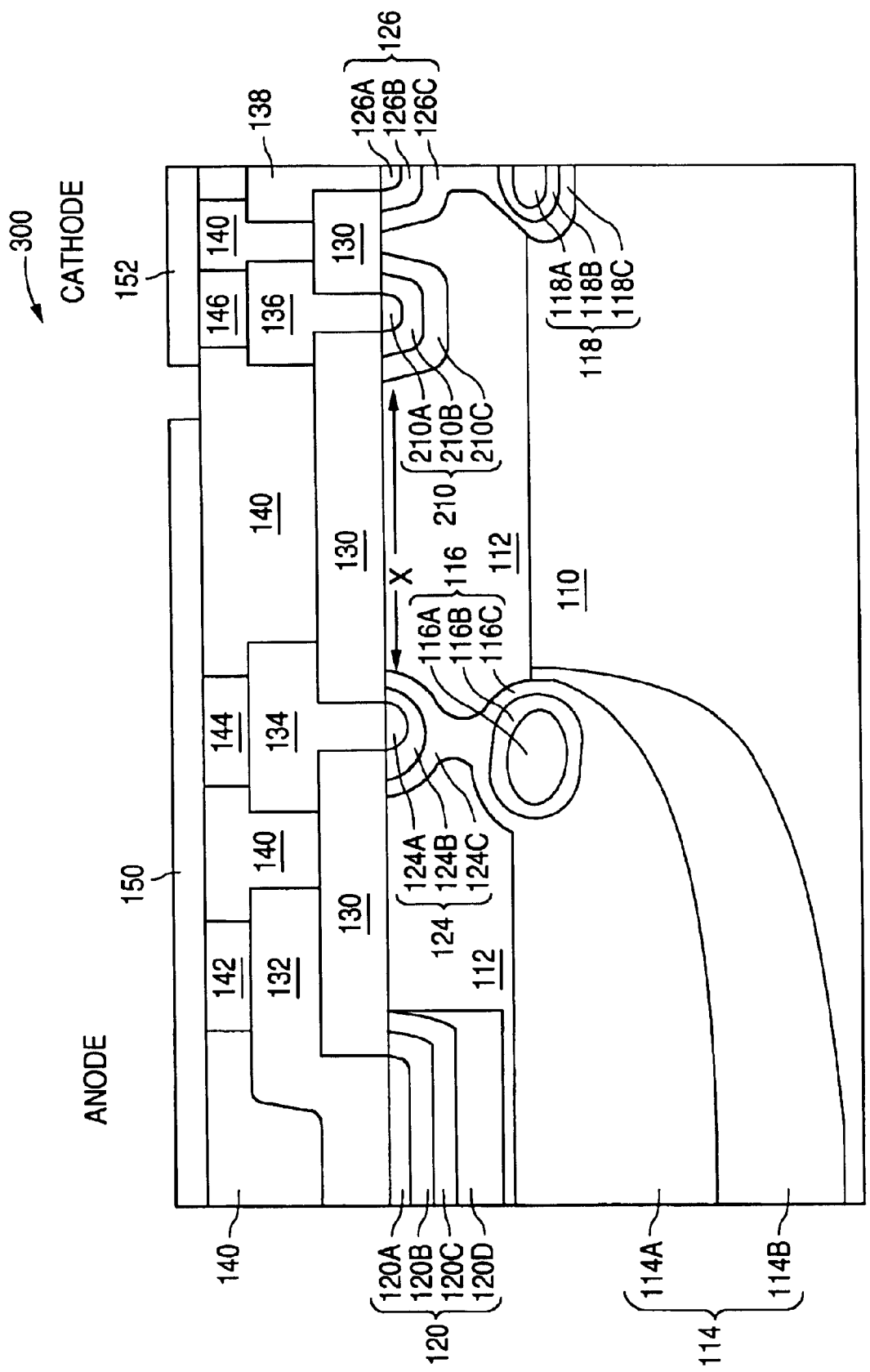
FIG. 3 is a cross-sectional view illustrating an example of a silicon controlled rectifier (SCR) structure 300 in accordance with an alternate embodiment of the present invention.

FIG. 3 shows a cross-sectional view that illustrates an example of a silicon controlled rectifier (SCR) structure 300 in accordance with an alternate embodiment of the present invention. Structure 300 is similar to structure 200 and, as a result, utilizes the same reference numerals to designate the elements which are common to both structures. As shown in FIG. 3, SCR structure 300 differs from SCR structure 200 in that structure 300 does not include p-type up region 212.

Figure 4:
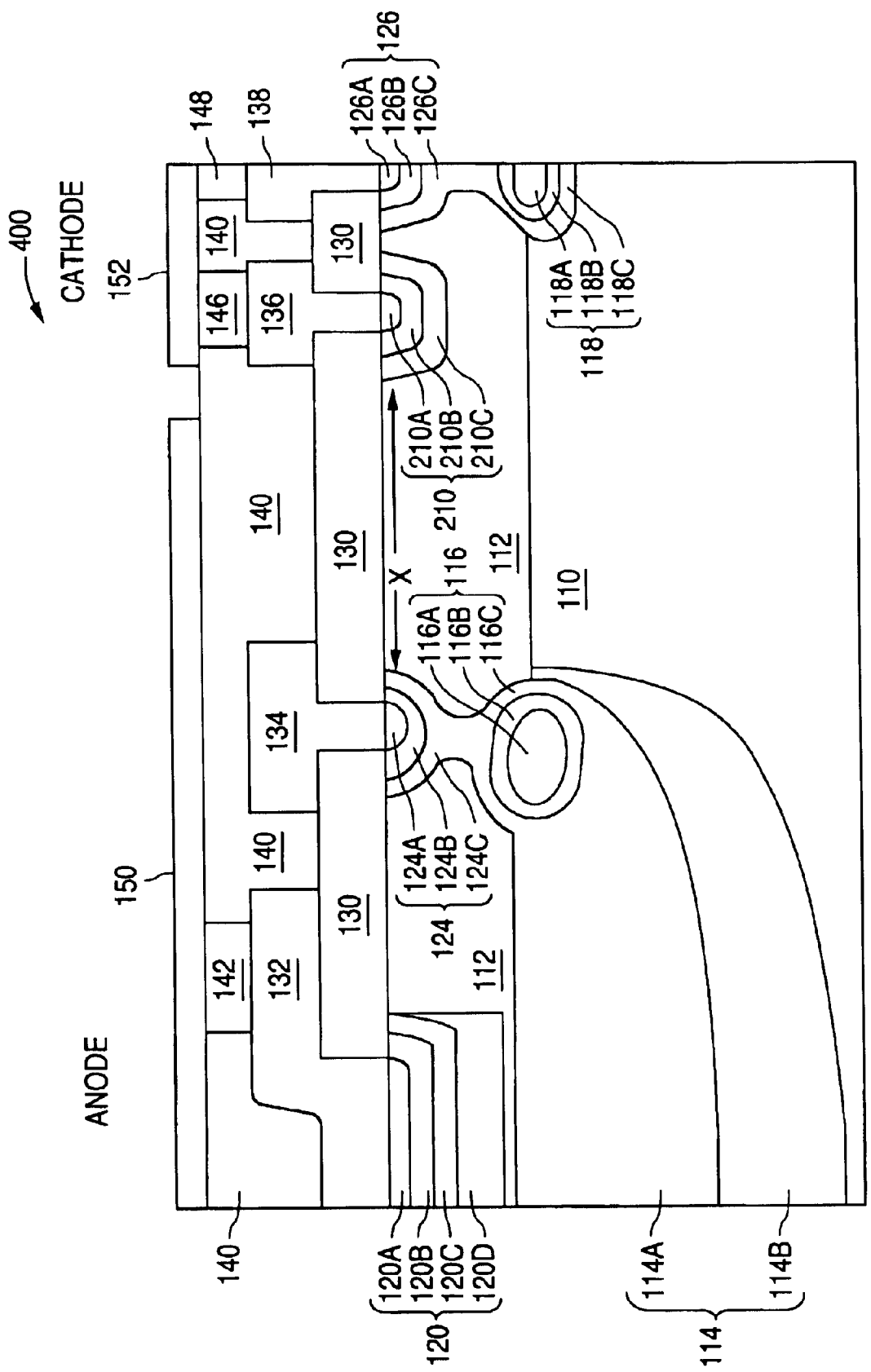
FIG. 4 is a cross-sectional view illustrating an example of a silicon controlled rectifier (SCR) structure 400 in accordance with an alternate embodiment of the present invention.

FIG. 4 shows a cross-sectional view that illustrates an example of a silicon controlled rectifier (SCR) structure 400 in accordance with an alternate embodiment of the present invention. Structure 400 is similar to structure 300 and, as a result, utilizes the same reference numerals to designate the elements which are common to both structures. As shown in FIG. 4, SCR structure 400 differs from SCR structure 300 in that structure 400 does not include contact structure 144.

SCR structures 200, 300, and 400 operate the same as SCR structure 100 except for variations in the performance characteristics of the structures. FIGS. 5A-5D show graphs that illustrates a comparison between the operation of six SCR structures in accordance with the present invention. The six SCR structures include structures 100, 200, 300, 400, 500, and 600 where structure 500 is represented by structure 400 with the p-type region 122 of structure 100, and structure 600 is represented by structure 400 with the p-type region 210 and p-type up region 212 of structure 200.

Figure 5A:
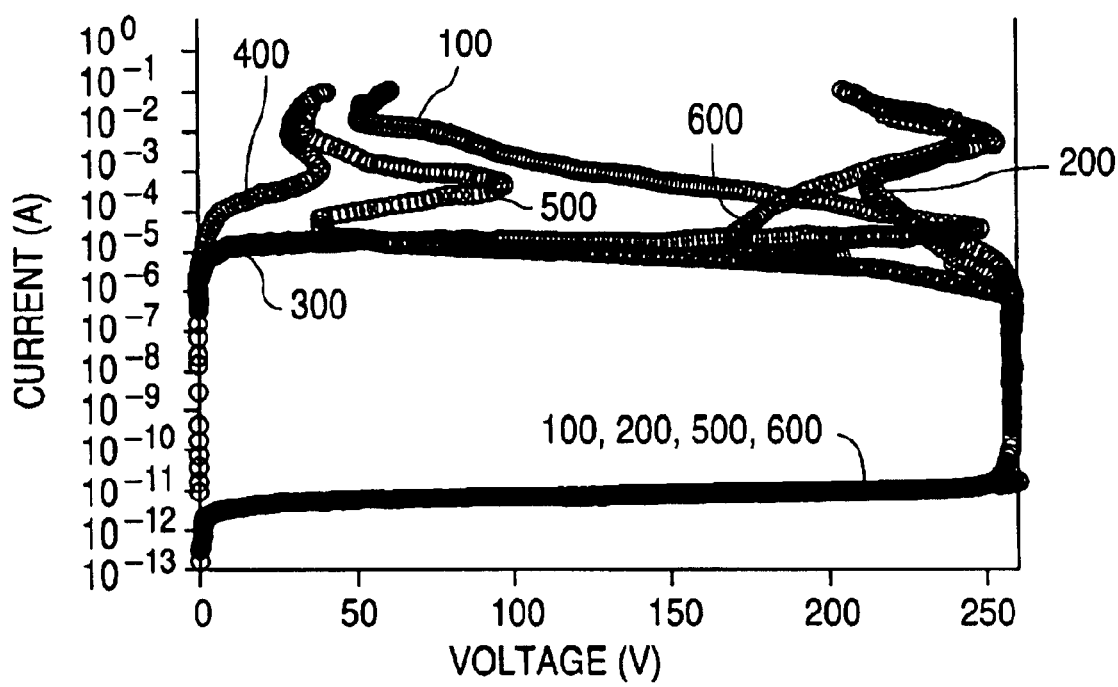
FIGS. 5A-5D are graphs illustrating a comparison between the operation of a number of SCR structures in accordance with the present invention.
Figure 5B:
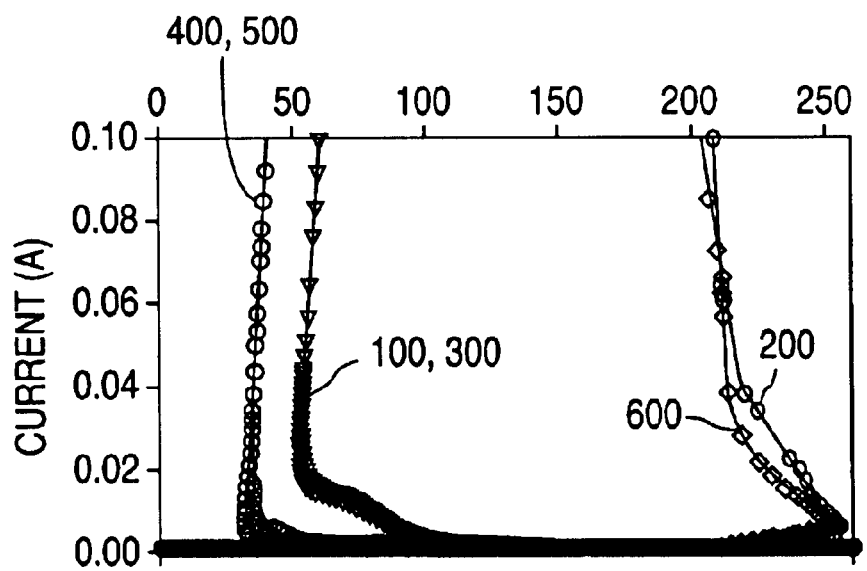
Figure 5C:
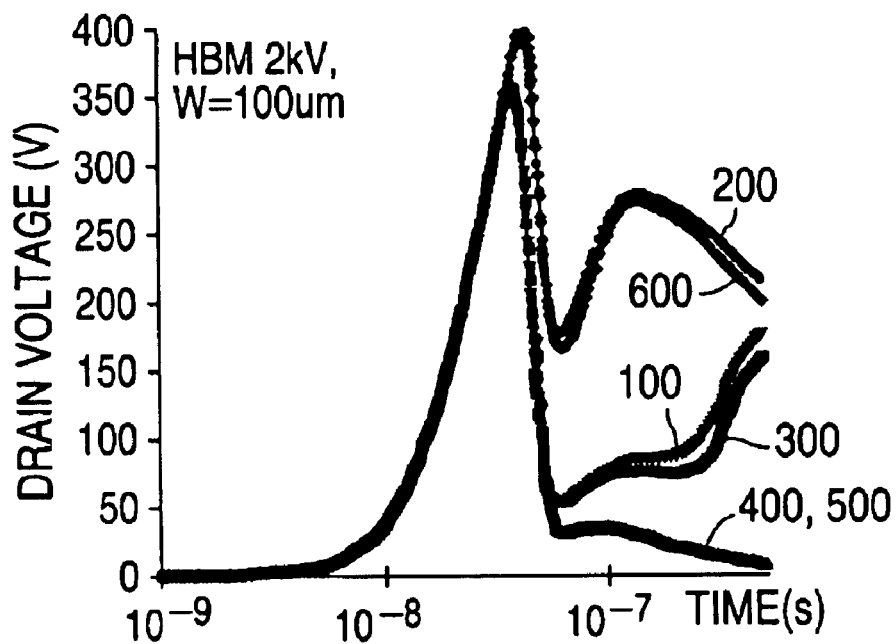
Figure 5D:
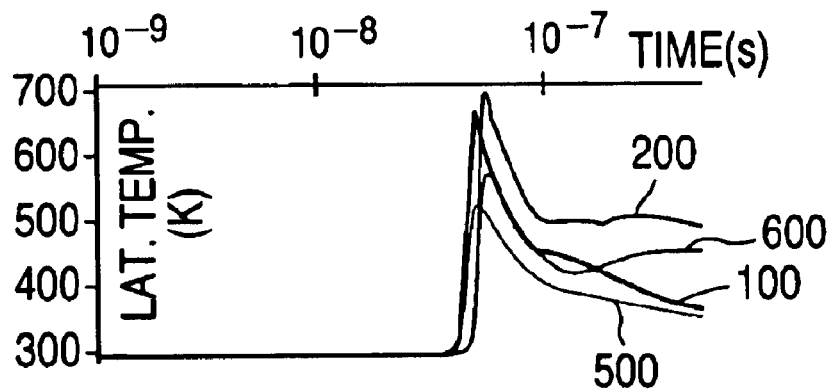

FIG. 5A shows a graph that illustrates current versus voltage for the six SCR structures in accordance with the present invention. FIG. 5B shows the graph of FIG. 5A with a different current scale that illustrates current versus voltage for the six SCR structures in accordance with the present invention. FIG. 5C shows a graph that illustrates drain voltage versus time following an ESD event for the six SCR structures in accordance with the present invention. FIG. 5D shows a graph that illustrates lattice temperature versus time following an ESD event for a number of the SCR structures in accordance with the present invention.

As shown in FIG. 5A, one of the advantages of the present invention is that structures 100, 200, 500, and 600 have breakdown voltages of approximately 250V with very low current, while structures 300 and 400 have poorer breakdown characteristics. As shown in FIG. 5B, of these structures, structures 100 and 500 have substantially lower holding voltages than structures 200 and 600. As shown in FIG. 5C, where the drain voltage is shown over time following an ESD event, structures 100 and 500 have good performance. As shown in FIG. 5D (which only shows four of the six structures), structures 100 and 500 also have good performance.

Figure 6:
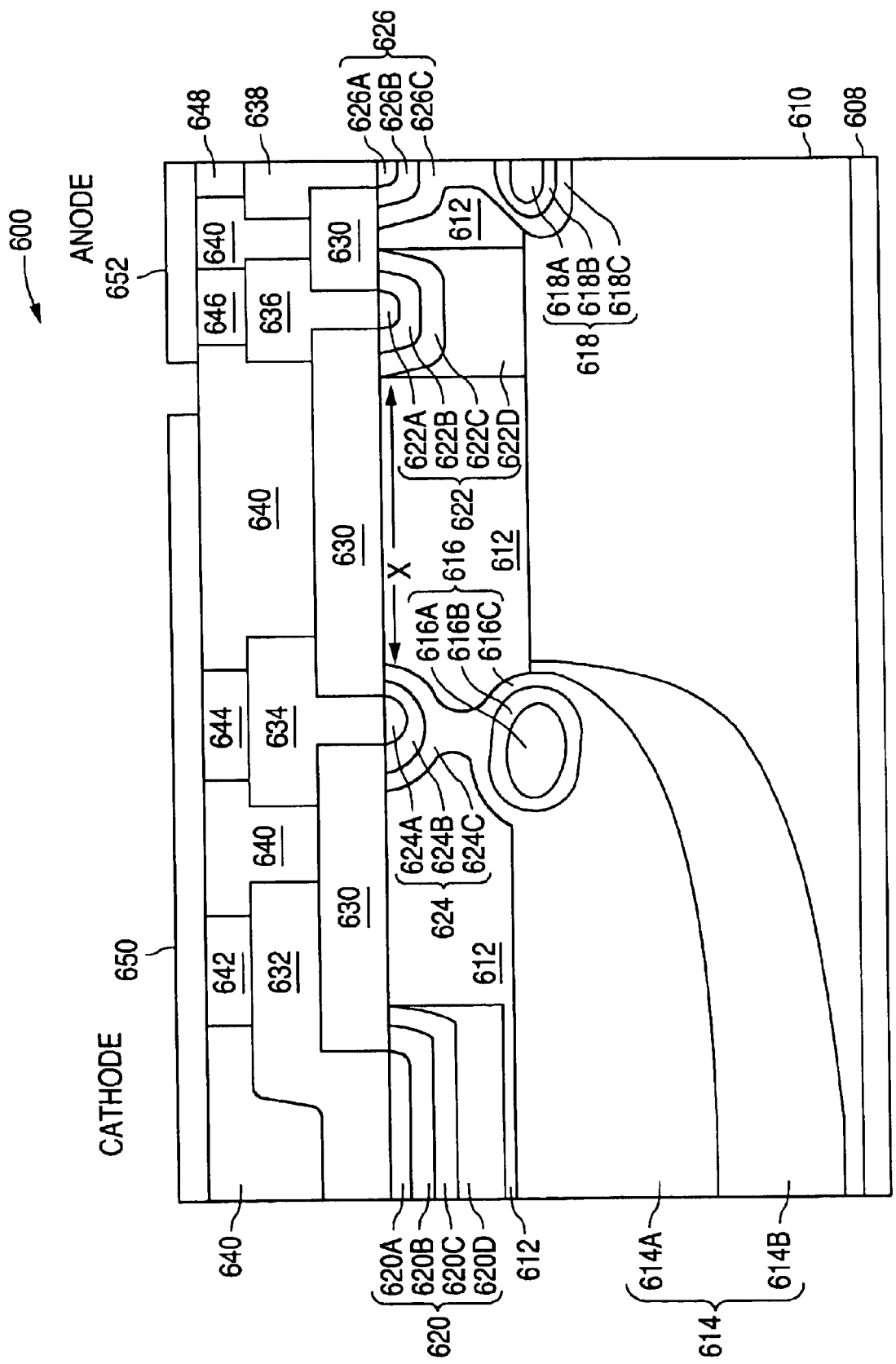
FIG. 6 is a cross-sectional view illustrating an example of a silicon controlled rectifier (SCR) structure 600 with opposite conductivity types in accordance with the present invention.

In addition to SCR structures 100, 200, 300, and 400, the present invention includes SCR structures that utilize the opposite conductivity types. FIG. 6 shows a cross-sectional view that illustrates an example of a silicon controlled rectifier (SCR) structure 600 with opposite conductivity types in accordance with the present invention.

As shown in FIG. 6, SCR structure 600 includes a p-type substrate 608, and an n-type epitaxial layer 610 that is formed on substrate 608. In addition, SCR structure 600 includes a first p-type well 612 that is formed in epitaxial layer 610, and a second p-type well 614 that is formed in epitaxial layer 610 below a portion of first p-well 612. P-well 614 includes a center region 614A and an outer region 614B that adjoins center region 614A. Outer region 614B represents the diffusion tail of center region 614A.

Further, SCR structure 600 includes a p-type first sinker up region 616 that is formed in center region 614A and the lower region of p-well 612 near the upper junction between epitaxial layer 610 and p-well 614. First sinker up region 616 has a center region 616A, an inner region 616B that adjoins center region 616A, and an outer region 616C that adjoins inner region 616B. Regions 616B and 616C represent the diffusion tails of center region 616A.

Center region 616A has the fifth dopant concentration, inner region 616B has the sixth dopant concentration, and outer region 616C and p-well 614 have the seventh dopant concentration. In addition, p-well 612 and outer region 614B of p-well 614 have the eighth dopant concentration.

SCR structure 600 additionally includes a p-type second sinker up region 618 that is formed in epitaxial layer 610 and the lower region of p-well 612 a distance apart from first sinker up region 616. Second sinker up region 618 has a center region 618A, an inner region 618B that adjoins center region 618A, and an outer region 618C that adjoins inner region 618B. Regions 618B and 618C represent the diffusion tails of center region 618A. Center region 618A has the fifth dopant concentration, inner region 618B has the sixth dopant concentration, and outer region 618C has the seventh dopant concentration.

Further, SCR structure 600 includes an n-type region 620 that is formed in the top surface of p-well 612. N-type region 620 has a center region 620A, an inner region 620B that adjoins center region 620A, and an outer region 620C that adjoins inner region 620B. The first and second outer regions 620B and 620C represent the diffusion tails of center region 620A. In addition, n-type region 620 includes an n-well 620D that contacts outer region 620C and extends down near center region 614A of p-well 614.

Center region 620A has the first dopant concentration, and inner region 620B has the second dopant concentration. In addition, outer region 620C and n-well 620D have the third dopant concentration, and epitaxial layer 610 has the fourth dopant concentration.

SCR structure 600 additionally includes an n-type region 622 that is formed in p-well 612 to extend from the top surface of swell 612 to the top surface of n-type epitaxial layer 610. N-type region 622 has a center region 622A, an inner region 622B that adjoins center region 622A, and an outer region 622C that adjoins inner region 622B. In addition, n-type region 622 includes a n-well 622D that contacts both outer region 622C and n-type epitaxial layer 610. The inner and outer regions 622B and 622C represent the diffusion tails of center region 622A.

Center region 622A has the first dopant concentration, inner region 122B has the second dopant concentration, and outer region 622C and p-well 622D have the third dopant concentration. N-well region 620D is shallower than n-well region 622D due to the out diffused presence of p-well 614.

SCR structure 600 further includes a first p-type sinker down region 624 that is formed in the top surface of epitaxial layer 612 between and spaced apart from n-type regions 620 and 622. First sinker down region 624, which is formed over first sinker up region 616, includes a center region 624A, an inner region 624B that adjoins center region 624A, and an outer region 624C that adjoins both inner region 624B and outer region 616C of first sinker up region 616. Center region 624A has the fifth dopant concentration, inner region 624B has the sixth dopant concentration, and outer region 624C has the seventh dopant concentration. Regions 624B and 624C represent the diffusion tails of center region 624A.

In addition, SCR structure 600 includes a second p-type sinker down region 626 that is formed in the top surface of p-well 612 spaced apart from n-type regions 620 and 622 and first sinker down region 624. Second sinker down region 626, which is formed over second sinker up region 618, includes a center region 626A, an inner region 626B that adjoins center region 626A, and an outer region 626C that adjoins both inner region 626B and outer region 618C of second sinker up region 618. Center region 626A has the fifth dopant concentration, inner region 626B has the sixth dopant concentration, and outer region 626C has the seventh dopant concentration. Regions 626B and 626C represent the diffusion tails of center region 620A.

As further shown in FIG. 6, SCR structure 600 includes a layer of isolation material 630 that is formed on epitaxial layer 610, and an n+ polysilicon region 632 that is formed on isolation layer 630, and through isolation layer 630 to make electrical connections with n-type region 620. In addition, SCR structure 600 includes a p+ polysilicon region 634 that is formed on isolation layer 630, and through isolation layer 630 to make electrical connections with p-type first sinker down region 624.

SCR structure 600 also includes an n+ polysilicon region 636 that is formed on isolation layer 630, and through isolation layer 630 to make an electrical connection with n-type region 622. SCR structure 600 further includes an n+ polysilicon region 638 that is formed on isolation layer 630, and through isolation layer 630 to make an electrical connection with second sinker down region 626. Polysilicon regions 632, 634, 636, and 638 are spaced apart from each other (and can include a very thin oxide layer that contacts the epi layer which is unavoidably introduced by some fabrication processes). In addition, polysilicon regions 632, 634, 636, and 638 can include an overlying layer of silicide. In an alternate embodiment, polysilicon regions 632 and 634 can be formed as a single poly layer.

SCR structure 600 additionally includes a layer of isolation material 640 that is formed over oxide layer 630 and polysilicon regions 632, 634, 636, and 638, a contact structure 642 that is formed through isolation layer 640 to make an electrical connection with polysilicon region 632, and a contact structure 644 that is formed through isolation layer 640 to make an electrical connection with polysilicon region 634.

Further, SCR structure 600 includes a contact structure 646 that is formed through isolation layer 640 to make an electrical connection with polysilicon region 636, and a contact structure 648 that is formed through isolation layer 640 to make an electrical connection with polysilicon region 638.

Further, SCR structure 600 includes a metal-1 trace 650 that is formed on isolation layer 640 to make an electrical connection with contact structures 642 and 644. Further, in an aspect of the present invention, metal-1 trace 650 covers a substantial portion of the distance X between n-type region 622 and p-type first sinker down region 624 to prevent or substantially reduce surface conduction. (Alternately, poly region 634 can cover the portion of the distance X to prevent the charge flow.)

Metal-1 trace 650, contact structure 642, contact structure 644, polysilicon region 632, polysilicon region 634, first n-type sinker down region 624, p-type region 620, and n-type epitaxial layer 612 can function as the cathode of an ESD diode structure (where the cathode is connected to a ground line).

SCR structure 600 additionally includes a metal-1 trace 652 that is formed on isolation layer 640 to make an electrical connection with contact structures 646 and 648. Metal-1 trace 652, contact structure 646, contact structure 648, polysilicon region 636, polysilicon region 638, second sinker down region 626, p-type region 622, and epitaxial layer 610 can function as the anode of the ESD diode structure (where the anode is connected to a to-be-protected node).

SCR structure 600 forms a PNP bipolar transistor that utilizes p+ polysilicon region 638, second sinker down region 626, sinker up region 618, and adjoining regions of p-type well 612 as the emitter, polysilicon region 636, n-type region 622, and n-type epitaxial layer 610 as the base, and p-well 612, well 614, first sinker down region 616, and first sinker up region 624 as the collector. SCR structure 600 also forms a NPN transistor that utilizes n-type region 620 as the emitter, p-well 612, well 614, first sinker up region 616, and first sinker down region 624 as the base, and n-type region 622 and epitaxial layer 110 as the collector.

Figure 7A:
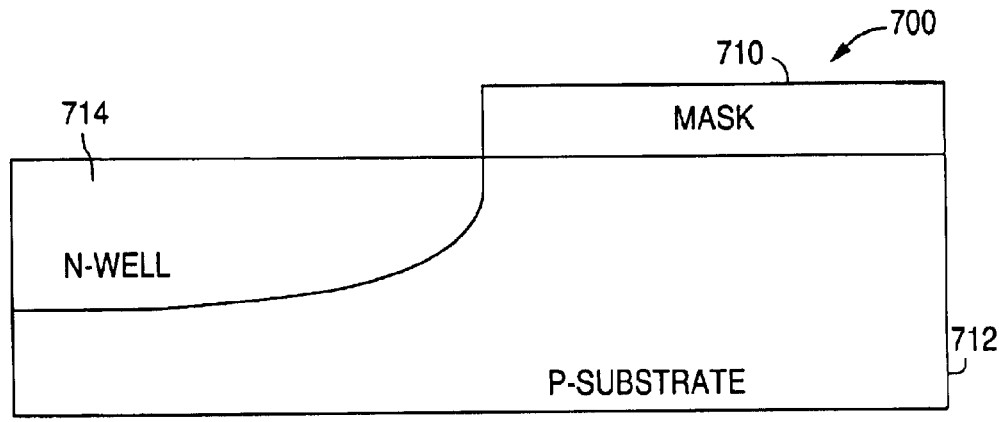
FIGS. 7A-7K are a series of cross-sectional diagrams illustrating an example of a method of forming a silicon controlled rectifier in accordance with the present invention.

FIGS. 7A-7K show a series of cross-sectional diagrams that illustrate an example of a method of forming a silicon controlled rectifier on a wafer 700 in accordance with the present invention. As shown in FIG. 7A, the method begins by forming and patterning a mask 710 on a p-type substrate 712 of wafer 700. After this, an n-type dopant is implanted into the exposed regions of substrate 712 to form an n-type well 714. Mask 710 is then removed.

Figure 7B:
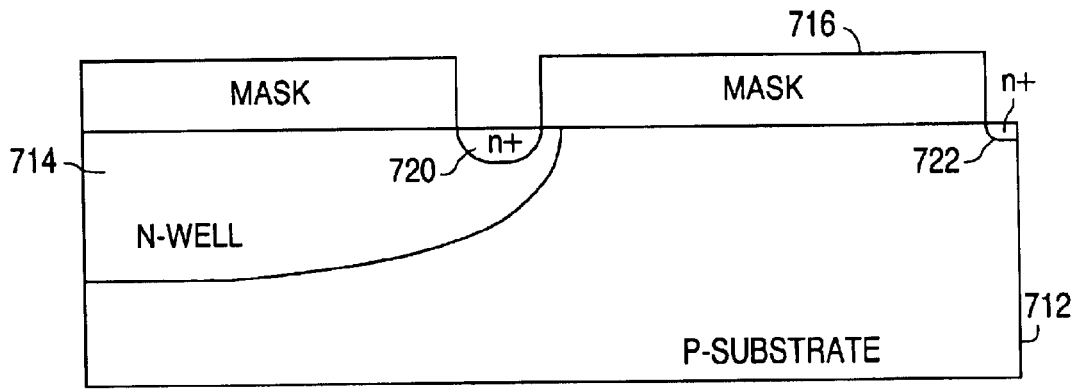

After n-well 714 has been formed, as shown in FIG. 7B, an implant mask 716 is formed and patterned on the top surface of substrate 712. The exposed areas of substrate 712 are then implanted with an n-type dopant to form a first n+ sinker up region 720 and a second spaced apart n+ sinker up region 722 in the top surface of substrate 712. Implant mask 716 is then removed.

Figure 7C:
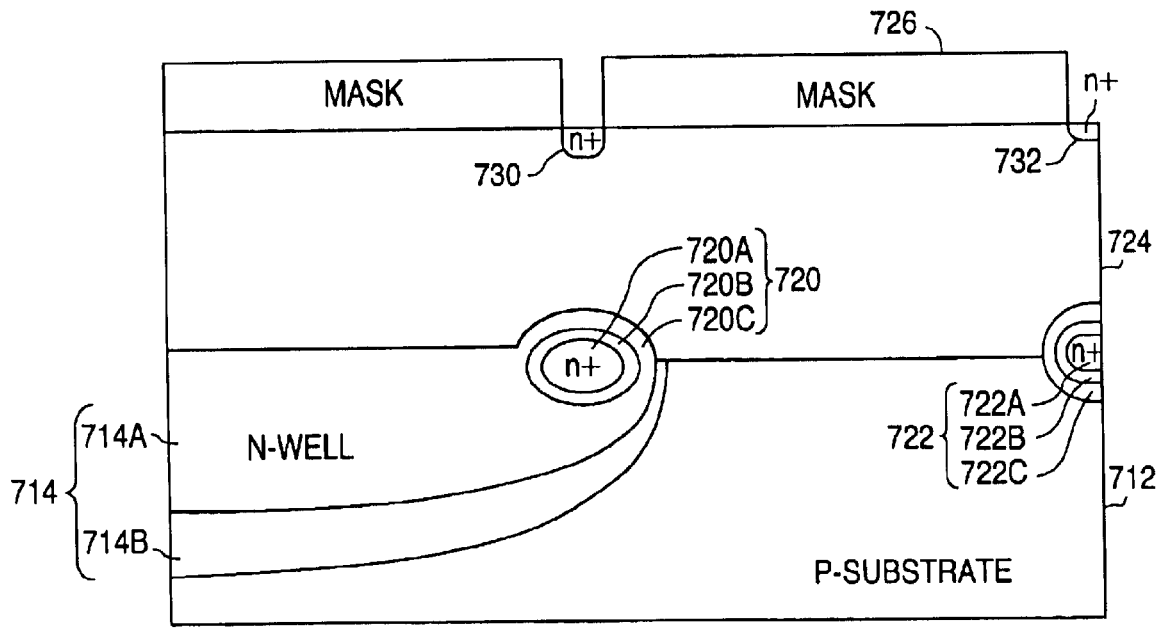

Next, as shown in FIG. 7C, an n-type epitaxial layer 724 is grown on the top surface of substrate 712. The epitaxial growth step causes the dopants in n-well 714 to diffuse and form a center region 714A, and an outer region 714B that adjoins center region 714A. The epitaxial growth step also causes the dopants in n+ sinker up region 720 to diffuse and form a center region 720A, an inner region 720B that adjoins center region 720A, and an outer region 720C that adjoins inner region 716B.

Center region 720A has the first dopant concentration, inner region 720B has the second dopant concentration, and outer region 720C and center region 714A have the third dopant concentration. Outer region 714B and epitaxial layer 724 have the fourth dopant concentration. The inner and outer regions 720B and 720C represent the diffusion tails of center region 720A.

The epitaxial growth step additionally causes the dopants in n+ second sinker up region 722 to diffuse and form a center region 722A, an inner region 722B that adjoins center region 722A, and an outer region 722C that adjoins inner region 722B. Center region 722A has the first dopant concentration, inner region 722B has the second dopant concentration, and outer region 722C has the third dopant concentration. The inner and outer regions 722B and 722C represent the diffusion tails of center region 722A.

Following the growth of epitaxial layer 724, an implant mask 726 is formed and patterned on the top surface of epitaxial layer 724. Once mask 726 has been formed, the exposed regions of epitaxial layer 724 are implanted with an n-type dopant to form an n+ first sinker down region 730 and an n+ sinker down region 732. Following this, mask 726 is removed.

Figure 7D:
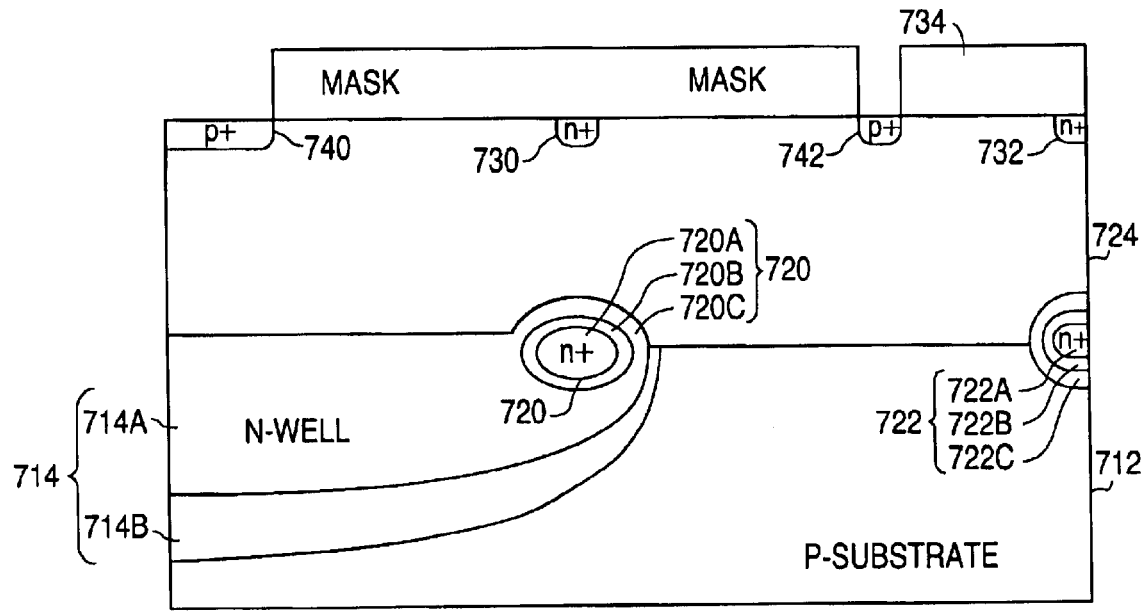

After mask 726 has been removed, as shown in FIG. 7D, an implant mask 734 is formed and patterned on the top surface of epitaxial layer 724. The exposed regions of epitaxial layer 724 are then implanted with a p-type dopant to form a first p+ region 740 and a second p+ region 742. Following this, mask 734 is removed.

Figure 7E:
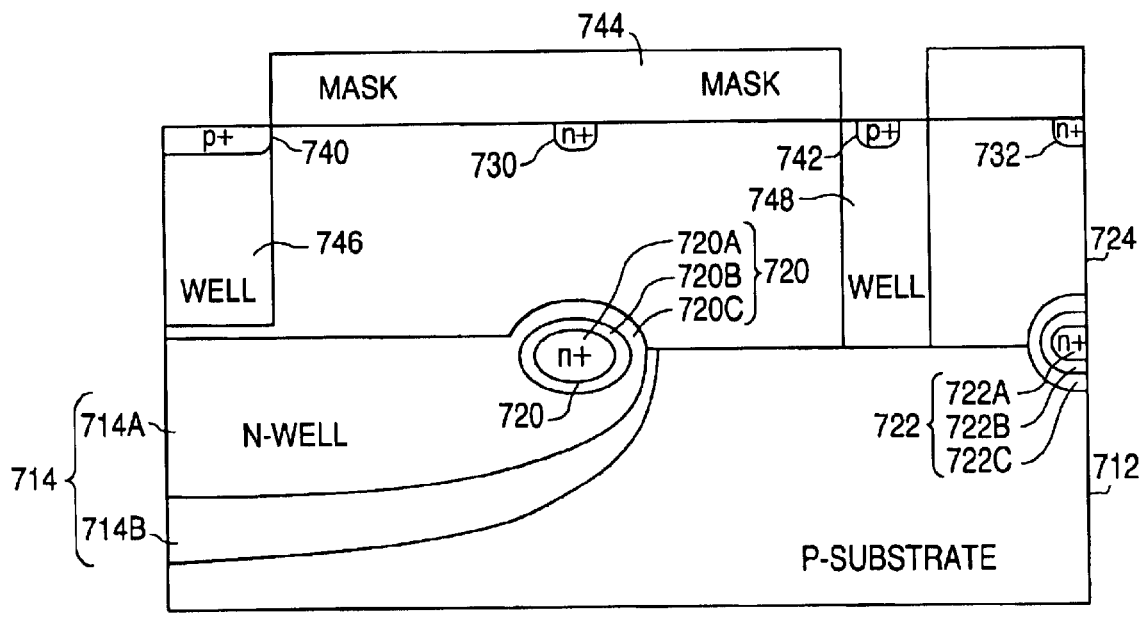

After mask 734 has been removed, as shown in FIG. 7E, an implant mask 744 is formed and patterned on the top surface of epitaxial layer 724. In accordance with the present invention, the exposed regions of epitaxial layer 724 are then implanted with a p-type dopant to form a p-type well 746 and a p-type well 748. Following this, mask 744 is removed.

Figure 7F:
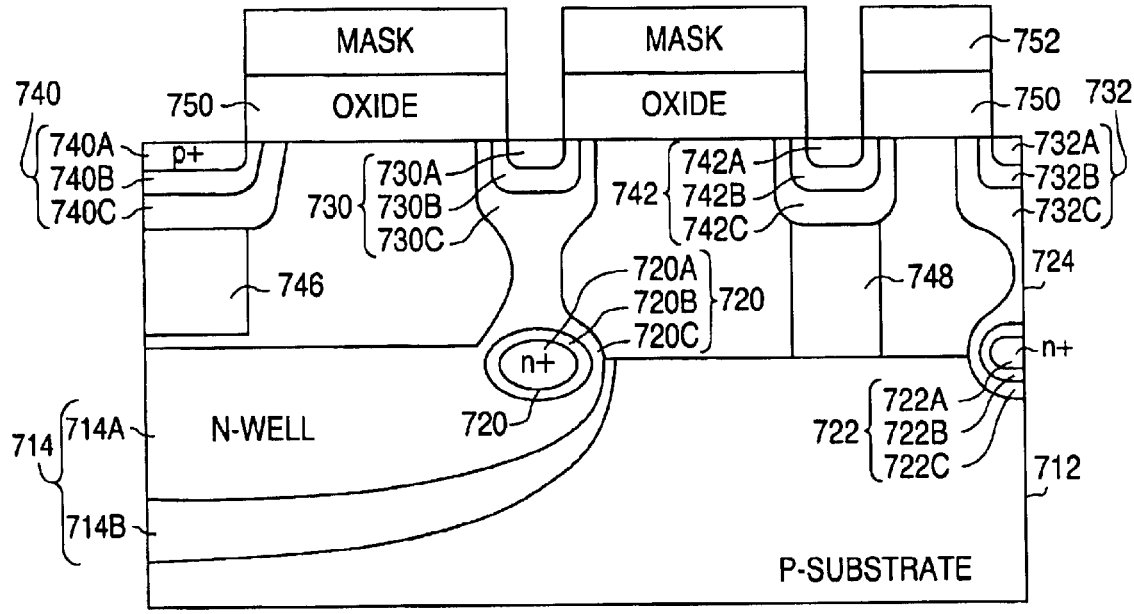

Next, as shown in FIG. 7F, wafer 700 is annealed which, in turn, causes the dopants in n+ sinker down region 730 to diffuse and form a center region 730A, an inner region 730B that adjoins center region 730A, and an outer region 730C that adjoins inner region 730B and outer region 720C of sinker up region 720.

Center region 730A has the first dopant concentration, inner region 730B has the second dopant concentration, and outer region 730C has the third dopant concentration. The inner and outer regions 7308 and 730C represent the diffusion tails of center region 730A.

The annealing step also causes dopants in n+ sinker down region 732 to diffuse and form a center region 732A, an inner region 732B that adjoins center region 732A, and an outer region 732C that adjoins inner region 732B and outer region 722C. Center region 732A has the first dopant concentration, inner region 732B has the second dopant concentration, and outer region 732 has the seventh dopant concentration. The inner and outer regions 732B and 7320C represent the diffusion tails of center region 732A.

The annealing step also causes dopants in p+ sinker down region 740 to diffuse and form a center region 740A, an inner region 740B that adjoins center region 7408A, and an outer region 740C that adjoins inner region 740B and p-well 746. Center region 740A has the fifth dopant concentration, inner region 740B has the sixth dopant concentration, and outer region 740C has the seventh dopant concentration. The first and second outer regions 740B and 740C represent the diffusion tails of center region 740A.

The annealing step further causes dopants in p+ region 742 to diffuse and form a center region 742A, an inner region 742B that adjoins center region 742A, and an outer region 742C that adjoins inner region 742B and p-well 748. Center region 742A has the fifth dopant concentration, inner region 742B has the sixth dopant concentration, and outer region 742C has the seventh dopant concentration. The first and second outer regions 7428 and 7420C represent the diffusion tails of center region 742A.

Following the annealing step, the method continues by forming a layer of oxide 750 on the top surface of epitaxial layer 724, followed by the formation and patterning of an oxide mask 752. Once oxide mask 752 has been formed and patterned, the exposed areas of oxide layer 750 are then etched until the top surface of epitaxial layer 724 is exposed over p-type regions 740 and 742 and sinker down regions 730 and 732. Oxide mask 752 is then removed.

Figure 7G:
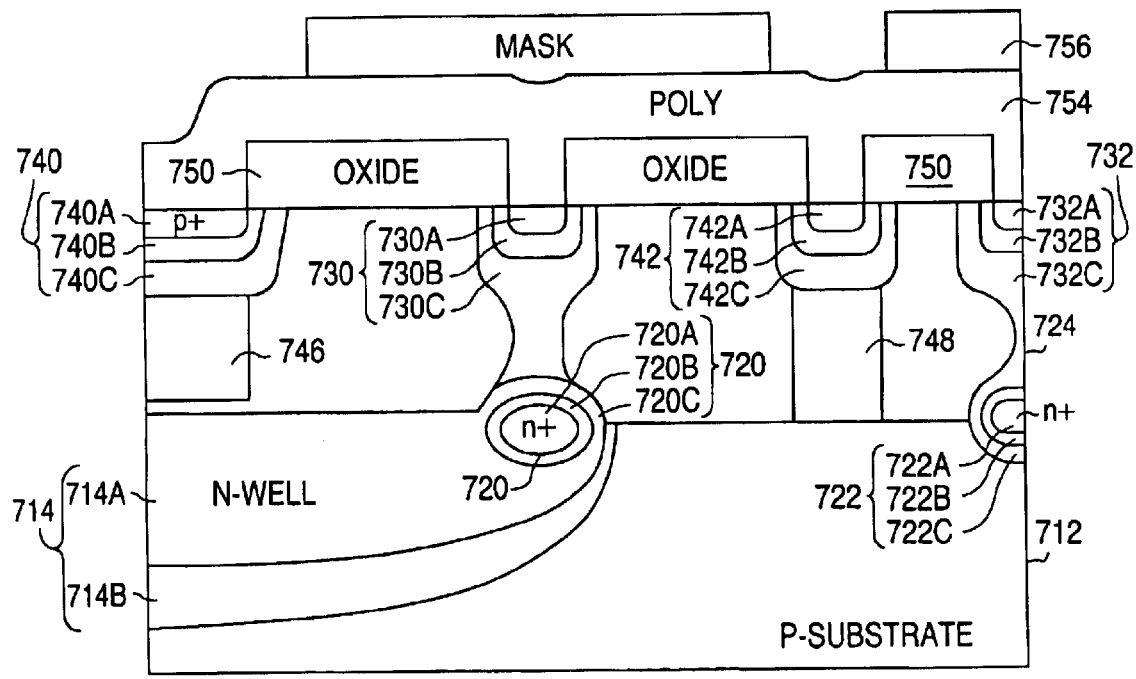

Next, as shown in FIG. 7G, a layer of polysilicon 754 is formed on epitaxial layer 724 and oxide layer 750, followed by the formation and patterning of a p-type implant mask 756 on polysilicon layer 754. After this, the regions of polysilicon layer 754 that are exposed by mask 756 are implanted to form p+ polysilicon regions. Mask 756 is then removed.

Figure 7H:
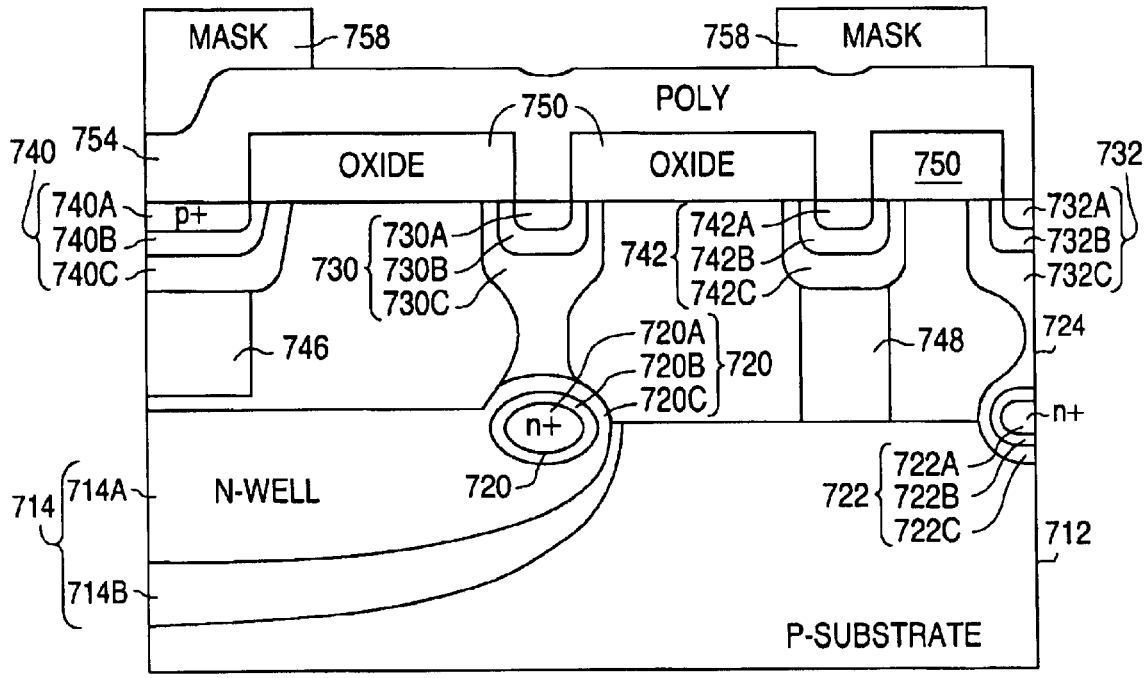

As shown in FIG. 7H, after mask 756 has been removed, an n-type implant mask 758 is formed and patterned on polysilicon layer 754. After this, the regions of polysilicon layer 754 that are exposed by mask 758 are implanted to form n+ polysilicon regions. Mask 758 is then removed. (A layer of suicide can optionally be formed on polysilicon layer 754.)

Figure 7I:
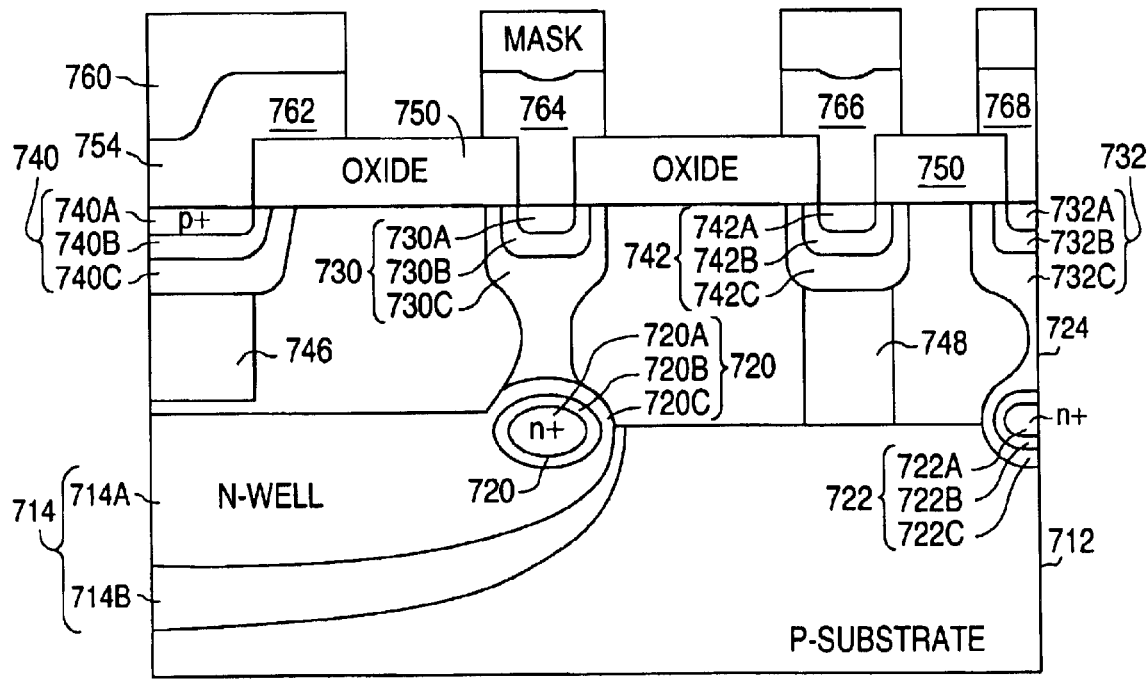
Figure 7J:
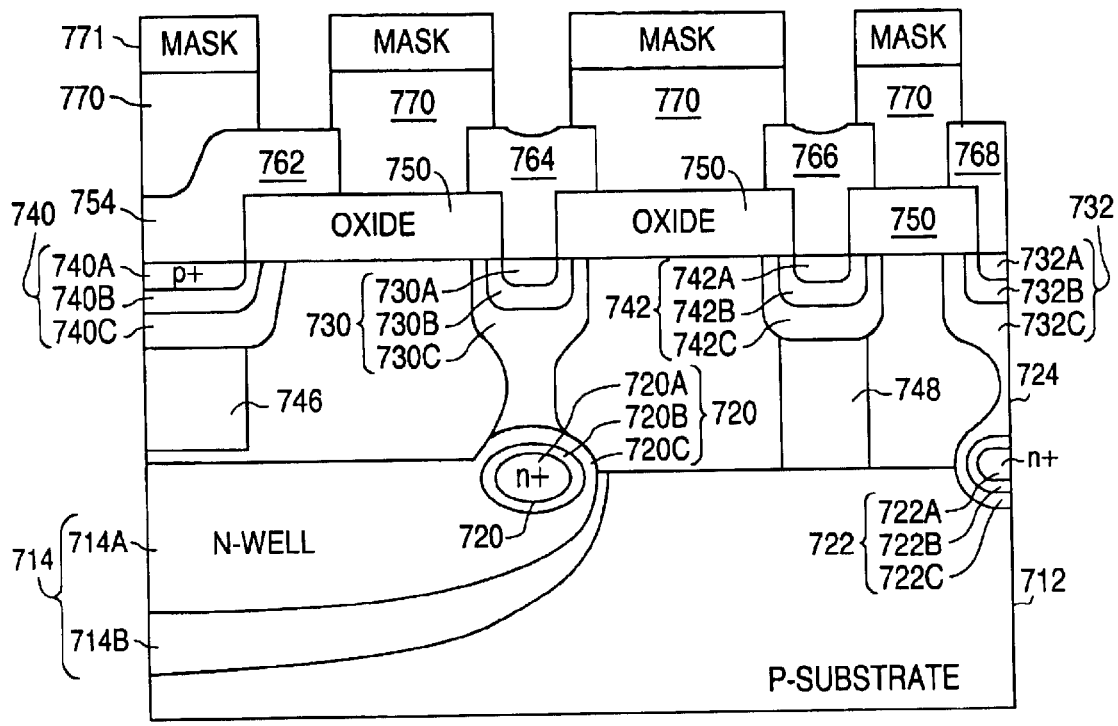

Following this, as shown in FIG. 7I, a poly mask 760 is formed and patterned over polysilicon layer 754. The regions of polysilicon layer 754 that are exposed by mask 760 are then etched to form a poly region 762, such as poly region 132, a poly region 764, such as poly region 134, a poly region 766, such as poly region 136, and a poly region 768, such as poly region 138. Mask 760 is then removed.

Next, as shown in FIG. 7B, a layer of oxide 770 is formed and planarized on oxide layer 750 and poly regions 762, 764, 766, and 768, followed by the formation and patterning of a contact mask 771. Once mask 771 has been formed, the exposed regions of oxide layer 770 are etched to form openings that expose regions on the top surfaces of poly regions 762, 764, 766, and 768. Mask 771 is then removed.

Figure 7K:
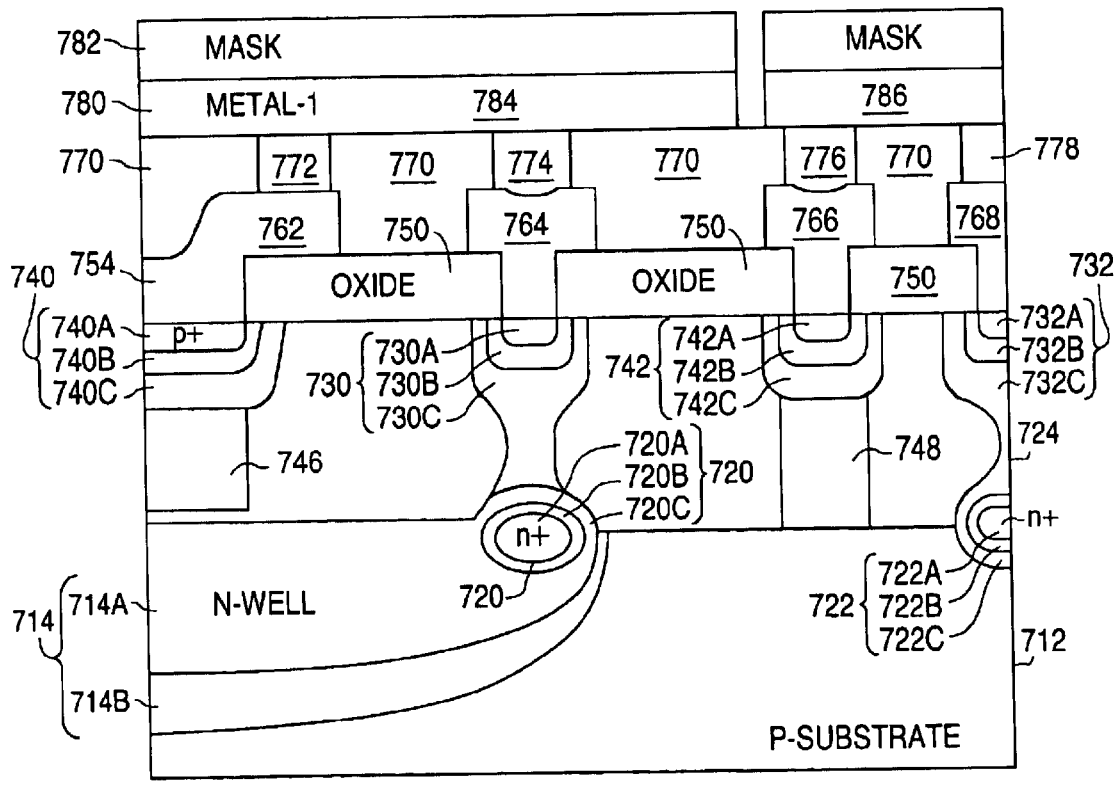

Once mask 771 has been removed, as shown in FIG. 7K, a layer of contact material, which can include a diffusion barrier layer and a metallic layer, is formed on oxide layer 770 and poly regions 762, 764, 766, and 768 to fill up the openings. The layer of contact material is then planarized to form contact structures 772, 774, 776, and 778 that make electrical connections with poly regions 762, 764, 766, and 768, respectively.

After this, a metal-1 layer 780 is formed on oxide layer 770 and contact structures 772, 774, 776, and 778, followed by the formation and patterning of a metal-1 mask 782. Once mask 782 has been formed, the exposed regions of metal-1 layer 780 are etched to form a metal-1 trace 784, such as metal-1 trace 150, and a metal-1 trace 786, such as metal-1 trace 152. Mask 782 is then removed, and the process continues with the conventional steps.

When an SCR structure is formed that includes p-type region 210 and p-type up region 212 in lieu of p-type region 122, p-type region 210 is formed as is p-type region 122, while p-type up region 212 is formed by masking and implanting substrate 110 to place a p+ region at the surface of substrate 110.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A silicon controlled rectifier comprising:
   a first semiconductor material of a first conductivity type, the first semiconductor material having a top surface;

a second semiconductor material of a second conductivity type formed on the first semiconductor material, the second semiconductor material having a top surface and a dopant concentration;

a first semiconductor region of the first conductivity type formed in the second semiconductor material, the first semiconductor region contacting the top surface of the second semiconductor material;

a second semiconductor region of the second conductivity type formed in the second semiconductor material;

a third semiconductor region of the first conductivity type formed in the second semiconductor material, the second semiconductor region lying between and spaced apart from the first and third semiconductor regions; and a fourth semiconductor region of the second conductivity type formed in the second semiconductor material, the first, second, third, and fourth semiconductor regions being spaced apart from each other.

2. The silicon controlled rectifier of claim 1 wherein the third semiconductor region extends from the top surface of the second semiconductor material to the top surface of the first semiconductor material.

3. The silicon controlled rectifier of claim 2 wherein the fourth semiconductor region extends from the top surface of the second semiconductor material to the first semiconductor material.

4. The silicon controlled rectifier of claim 3 wherein the second semiconductor region includes:

a first highly doped region that contacts the top surface of the second semiconductor material; and a second highly doped region that lies below the first highly doped region, the first and second highly doped regions being spaced apart by a region having a lower dopant concentration.

5. The silicon controlled rectifier of claim 4 wherein the fourth semiconductor region includes:

a third highly doped region that contacts the surface of the second semiconductor material; and a fourth highly doped region that lies below the third highly doped region, the third and fourth highly doped regions being spaced apart by a region having a lower dopant concentration.

6. The silicon controlled rectifier of claim 5 wherein the third semiconductor region includes a plurality of dopant concentration regions that lie between the top surface of the second semiconductor material and the top surface of the first semiconductor material.

7. The silicon controlled rectifier of claim 6 wherein the plurality of dopant concentrations continually decrease when moving from the top surface of the second semiconductor material to the top surface of the first semiconductor material.

8. The silicon controlled rectifier of claim 6 wherein the plurality of dopant concentrations decrease and then increase when moving from the top surface of the second semiconductor material to the top surface of the first semiconductor material.

9. The silicon controlled rectifier of claim 6 and further comprising:

a layer of isolation material formed on the second semiconductor material, the layer of isolation material having a plurality of openings that expose the first, third, and fourth semiconductor regions;

a first conductive region formed on the isolation material that makes an electrical connection with the first semiconductor region;

a second conductive region formed on the isolation material that makes an electrical connection with the third semiconductor region; and a third conductive region formed on the isolation material that makes an electrical connection with the fourth semiconductor region.

10. The silicon controlled rectifier of claim 9 and further comprising a fifth conductive region that contacts the first conductive region, and wherein the fifth conductive region extends laterally over the second semiconductor material from the second semiconductor region towards the third semiconductor region a distance to limit charge carriers from flowing between the second and third semiconductor regions along the top surface of the second semiconductor material.

11. The silicon controlled rectifier of claim 10 and further comprising a sixth conductive region that contacts the second and third conductive regions.

12. The silicon controlled rectifier of claim 9 wherein the layer of isolation material includes an opening that exposes the second semiconductor region, a fourth conductive region making an electrical connection with the second semiconductor region.

13. The silicon controlled rectifier of claim 12 and further comprising a fifth conductive region that contacts the first and fourth conductive regions, and wherein the fifth conductive region extends laterally over the second semiconductor material from the second semiconductor region towards the third semiconductor region a distance to limit charge carriers from flowing between the second and third semiconductor regions along the top surface of the second semiconductor material.

14. The silicon controlled rectifier of claim 13 and further comprising a sixth conductive region that contacts the second and third conductive regions.

15. The silicon controlled rectifier of claim 1 wherein the third semiconductor region includes a plurality of dopant concentration regions that lie between the top surface of the second semiconductor material and the top surface of the first semiconductor material.

16. The silicon controlled rectifier of claim 15 wherein the plurality of dopant concentrations continually decrease when moving from the top surface of the second semiconductor material to the top surface of the first semiconductor material.

17. The silicon controlled rectifier of claim 16 wherein the plurality of dopant concentrations decrease and then increase when moving from the top surface of the second semiconductor material to the top surface of the first semiconductor material.

18. The silicon controlled rectifier of claim 17 and further comprising:

a layer of isolation material formed on the second semiconductor material, the layer of isolation material having a plurality of openings that expose the first, third, and fourth semiconductor regions;

a first conductive region formed on the isolation material that makes an electrical connection with the first semiconductor region;

a second conductive region formed on the isolation material that makes an electrical connection with the third semiconductor region; and a third conductive region formed on the isolation material that makes an electrical connection with the fourth semiconductor region.

19. The silicon controlled rectifier of claim 18 wherein the second and third conductive regions are electrically connected together.

20. A method of forming a silicon controlled rectifier, the method comprising the steps of:

forming a first semiconductor material of a first conductivity type, the first semiconductor material having a top surface;

forming a second semiconductor material of a second conductivity type on the first semiconductor material, the second semiconductor material having a top surface and a dopant concentration;

forming spaced-apart first and second semiconductor regions of the first conductivity type in the second semiconductor material; and forming spaced-apart third and fourth semiconductor regions of a second conductivity type in the second semiconductor material, the third semiconductor region lying between and spaced apart from the first and second semiconductor regions.

* * * * *

UNITED STATES PATENT AND TRADEMARK OFFICE
CERTIFICATE OF CORRECTION

PATENT NO. : 6,815,732 B1
DATED : November 9, 2004
INVENTOR(S) : Vashchenko et al.

It is certified that error appears in the above-identified patent and that said Letters Patent is hereby corrected as shown below:

Title page,
Item [56], References Cited, OTHER PUBLICATIONS, delete "HIgh" and replace with -- high --.

Column 6,
Line 15, delete "tall" and replace with -- tail --.
Line 56, delete "swell" and replace with -- p-well --.

Column 9,
Line 36, delete "7308" and replace with -- 730B --.
Line 63, delete "7428" and replace with -- 742B --.

Column 10,
Line 19, delete "suicide" and replace with -- silicide --.
Line 28, delete "7B" and replace with -- 7J --.

Signed and Sealed this

Fifteenth Day of February, 2005

JON W. DUDAS
*Director of the United States Patent and Trademark Office*